United States Patent
Nguyen et al.

(10) Patent No.: US 6,569,257 B1
(45) Date of Patent: May 27, 2003

(54) METHOD FOR CLEANING A PROCESS CHAMBER

(75) Inventors: Huong Thanh Nguyen, San Ramon, CA (US); Michael Barnes, San Ramon, CA (US); Li-Qun Xia, Santa Clara, CA (US); Ellie Yieh, San Jose, CA (US)

(73) Assignee: Applied Materials Inc., Santa Clara, CA (US)

( * ) Notice: Subject to any disclaimer, the term of this patent is extended or adjusted under 35 U.S.C. 154(b) by 0 days.

(21) Appl. No.: 09/710,357

(22) Filed: Nov. 9, 2000

(51) Int. Cl.[7] .................................................. B08B 3/00
(52) U.S. Cl. ..................... 134/26; 134/1.1; 134/22.1; 134/22.11; 134/30; 438/905
(58) Field of Search ............................. 134/1.1, 22.1, 134/22.11, 26, 30; 438/905

(56) References Cited

U.S. PATENT DOCUMENTS

| | | | |
|---|---|---|---|
| 4,820,377 A | * 4/1989 | Davis et al. | ................. 134/1 |
| 5,356,478 A | 10/1994 | Chen et al. | ................. 134/1 |
| 5,647,953 A | 7/1997 | Williams et al. | ......... 156/643.1 |
| 5,756,400 A | 5/1998 | Ye et al. | ................. 438/710 |
| 5,879,575 A | 3/1999 | Tepman et al. | ............... 216/68 |
| 6,060,397 A | 5/2000 | Seamons et al. | ............ 438/694 |
| 6,164,295 A | * 12/2000 | Ui et al. | ................... 134/1.1 |
| 6,274,058 B1 | * 8/2001 | Rajagopalan et al. | ...... 134/22.1 |

FOREIGN PATENT DOCUMENTS

JP     03183125    * 8/1991     ......... H01L/21/205

* cited by examiner

*Primary Examiner*—Randy Gulakowski
*Assistant Examiner*—M. Kornakov
(74) *Attorney, Agent, or Firm*—Moser, Patterson & Sheridan

(57) ABSTRACT

A method for cleaning silicon carbide and/or organosilicate layers from interior surfaces of a process chamber is disclosed. In one aspect, silicon carbide and/or organosilicate layers are cleaned from interior surfaces of a process chamber by treating it with a hydrogen/fluorine-based plasma. In another aspect, silicon carbide and/or organosilicate layer are cleaned from interior surfaces of the process chamber by treating it with a hydrogen-based plasma followed by a fluorine-based plasma. Alternatively, silicon carbide and/or organosilicate layers are cleaned from interior surfaces of the chamber by treating it with a fluorine-based plasma followed by a hydrogen-based plasma.

67 Claims, 5 Drawing Sheets

METHOD FOR CLEANING A PROCESS CHAMBER

BACKGROUND OF THE DISCLOSURE

1. Field of the Invention

The present invention relates to a method of cleaning a processing chamber used for integrated circuit fabrication processes.

2. Description of the Background Art

Integrated circuits have evolved into complex devices that can include millions of components (e. g., transistors, capacitors and resistors) on a single chip. The evolution of chip designs continually requires faster circuitry and greater circuit density. The demands for greater circuit density necessitate a reduction in the dimensions of the integrated circuit components.

As the dimensions of the integrated circuit components are reduced (e. g., sub-micron dimensions), the materials used to fabricate such components contribute to their electrical performance. For example, low dielectric constant (e. g., dielectric constant less than about 4.0) silicon carbide and/or organosilicate insulating layers may be used to electrically isolate metal interconnects (e. g., copper (Cu) and aluminum (Al)) on integrated circuits. The low dielectric constant silicon carbide and/or organosilicate insulating layers are needed to minimize capacitive coupling between adjacent metal interconnects. Capacitive coupling between adjacent metal interconnects may cause cross talk and/or resistance-capacitance (RC) delay which degrades the overall performance of the integrated circuit.

The low dielectric constant silicon carbide and/or organosilicate layers are typically formed using one or more process chambers of a semiconductor wafer processing system. However, during such layer formation, silicon carbide and/or organosilicate material may accumulate on interior surfaces of the process chambers used therefor. For example, using chemical vapor deposition (CVD) processes, silicon carbide and/or organosilicate material that is formed on a substrate may also be deposited on interior surfaces of process chambers, during a deposition step. In addition, for etch processes, silicon carbide and/or organosilicate material that is etched from a substrate may similarly be deposited on interior surfaces of the process chambers during an etch step.

Typically after several processing cycles, silicon carbide and/or organosilicate material that has accumulated on the interior surfaces of the process chamber must be removed to maintain continued process integrity. One technique proposed to clean material from interior surfaces of a process chamber utilizes a gas mixture of oxygen ($O_2$) and nitrogen trifluoride ($NF_3$). However, such a cleaning chemistry provides a slow etch rate (e. g., etch rates less than about 5000 Å/min) for removing silicon carbides and/or organosilicates from interior surfaces of process chambers.

Therefore, a need exists in the art for a cleaning chemistry suitable for removing silicon carbide and/or organosilicate deposits from interior surfaces of process chambers.

SUMMARY OF THE INVENTION

A method for cleaning a processing chamber of a semiconductor wafer processing system is provided. In one aspect, a processing chamber is cleaned by treating it using a hydrogen/fluorine-based plasma. The hydrogen/fluorine-based plasma reacts with silicon carbide and/or organosilicate layers formed on interior surfaces of the process chamber so as to remove such layers therefrom.

In another aspect, a processing chamber is cleaned by treating it using a hydrogen-based plasma followed by a fluorine-based plasma. Each of the plasmas reacts with silicon carbide and/or organosilicate layers formed on interior surfaces of the process chamber so as to remove such layers therefrom.

In yet another aspect, a process chamber is cleaned by treating it using a fluorine-based plasma followed by a hydrogen-based plasma. Each of the plasmas reacts with silicon carbide and/or organosilicate layers formed on interior surfaces of the process chamber so as to remove such layers therefrom.

BRIEF DESCRIPTION OF THE DRAWINGS

The teachings of the present invention can be readily understood by considering the following detailed description in conjunction with the accompanying drawings, in which.

DETAILED DESCRIPTION

Figure 1:
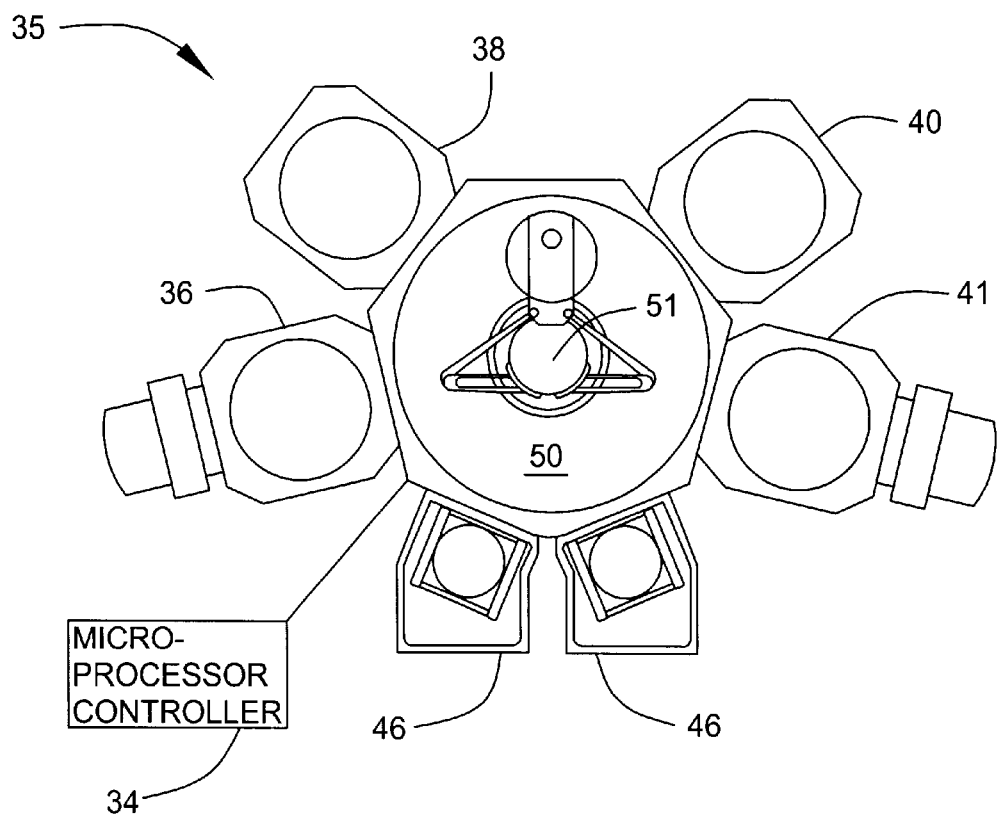
FIG. 1 depicts a schematic illustration of an apparatus that can be used for the practice of embodiments described herein.

FIG. 1 is a schematic representation of a wafer processing system 35 that can be used to perform integrated circuit fabrication in accordance with embodiments described herein. This apparatus typically comprises process chambers 36, 38, 40, 41, load-lock chambers 46, a transfer chamber 50, a microprocessor controller 54, along with other hardware components such as power supplies (not shown) and vacuum pumps (not shown). An example of such a wafer processing system is a CENTURA® System, commercially available from Applied Materials, Inc., Santa Clara, Calif.

Details of the wafer processing system 35 are described in commonly assigned U.S. Pat. No. 5,186,718, entitled, "Staged-Vacuum Substrate Processing System and Method", issued on Feb. 16, 1993, and is hereby incorporated by reference. The salient features of this system 35 are briefly described below.

The wafer processing system 35 includes a transfer chamber 50, containing a transfer robot 51. The transfer chamber 50 is coupled to load-lock chambers 46 as well as a cluster of process chambers 36, 38, 40, 41.

Substrates (not shown) are loaded into the wafer processing system 35 through load-lock chambers 46. Thereafter, transfer robot 51 moves the substrates between one or more of the process chambers 36, 38, 40, 41.

The process chambers 36, 38, 40, 41 are used to perform various integrated circuit fabrication sequences. For example, process chambers 36, 38, 40, 41 may include physical vapor deposition (PVD) chambers, ionized metal plasma physical vapor deposition (IMP PVD) chambers, chemical vapor deposition (CVD) chambers, rapid thermal process (RTP) chambers, and plasma etch chambers, among others.

Figure 2:
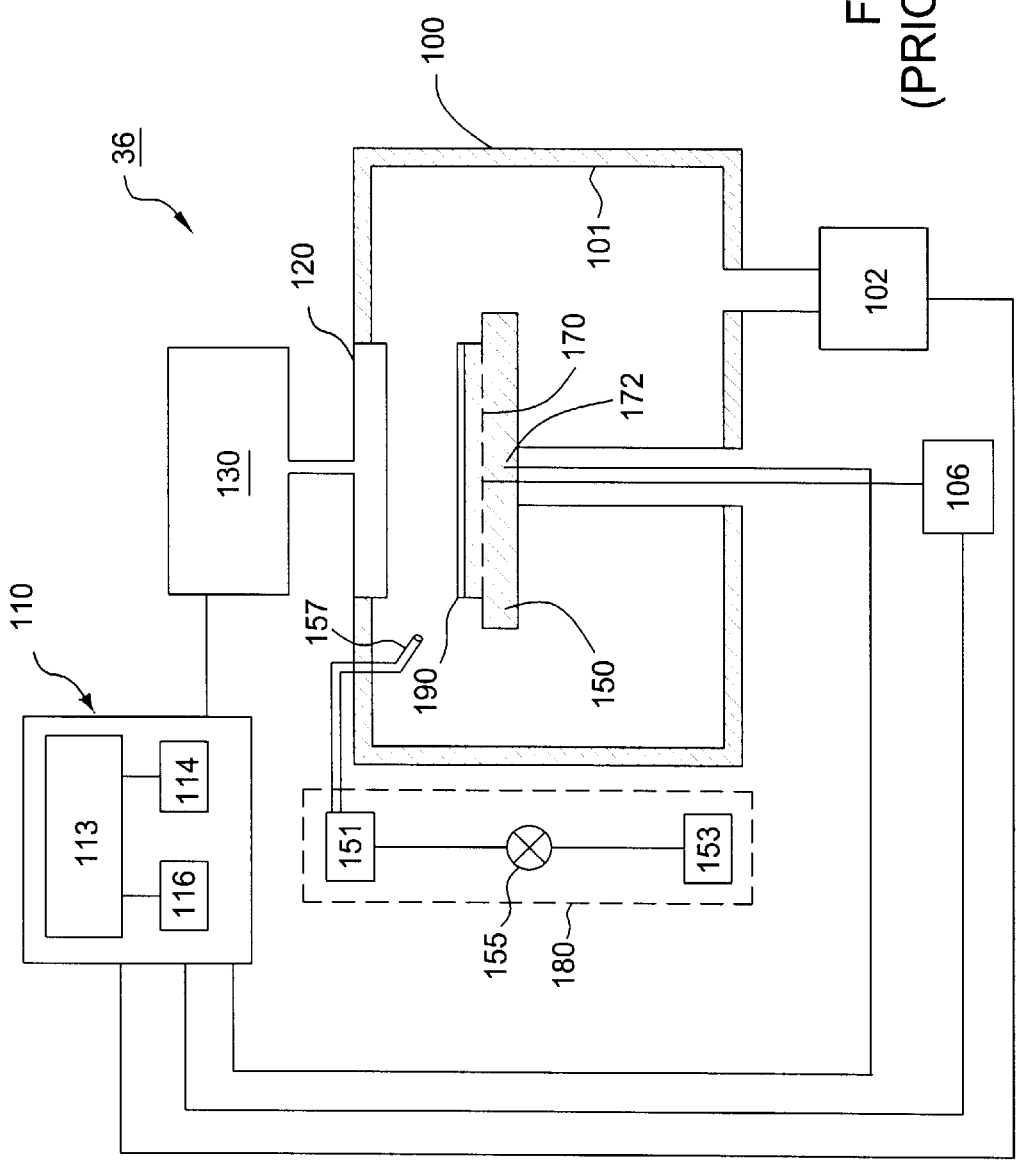
FIG. 2 depicts a schematic cross-sectional view of a chemical vapor deposition (CVD) chamber including a remote plasma source that can be used for the practice of embodiments described herein.

FIG. 2 depicts a schematic cross-sectional view of a chemical vapor deposition (CVD) process chamber 36 of wafer processing system 35. CVD process chamber 36 may be used to deposit silicon carbide and/or organosilicate layers on semiconductor wafers. An example of such a CVD process chamber 36 is a DXZ™ chamber, commercially available from Applied Materials, Inc., Santa Clara, Calif.

CVD process chamber 36 typically comprises a gas panel 130, a control unit 110, along with other hardware components such as power supplies and vacuum pumps. Details of the CVD process chamber 36 are described in commonly 30 assigned U.S. patent application Ser. No. 09/211,998, entitled "High Temperature Chemical Vapor Deposition Chamber", filed Dec. 14, 1998, and is herein incorporated by reference. The salient features of the CVD process chamber 36 are briefly described below.

The CVD process chamber 36 generally houses a support pedestal 150, which is used to support a substrate such as a semiconductor wafer 190. The support pedestal 150 can typically be moved in a vertical direction inside the chamber 36 using a displacement mechanism (not shown).

Depending on the specific process, the wafer 190 can be heated to some desired temperature prior to a layer deposition process. For example, the wafer support pedestal 150 may be heated by an embedded heater element 170. The pedestal 150 can be resistively heated by applying an electric current from an AC power supply 106 to the heater element 170. The wafer 190 is, in turn, heated by the pedestal 150.

A temperature sensor 172, such as a thermocouple, is also embedded in the wafer support pedestal 150 to monitor the temperature of the pedestal 150 in a conventional manner. The measured temperature is used in a feedback loop to control the power supplied to the heater element 170, such that the wafer temperature can be maintained or controlled at a desired temperature which is suitable for the particular process application.

A vacuum pump 102, is used to evacuate the process region 100 and to maintain the proper gas flows and pressure inside the process region 100. A showerhead 120, through which process gases are introduced into CVD process region 36, is located above the wafer support pedestal 150. The showerhead is coupled to a gas panel 130, which controls and supplies various gases used in different steps of the process sequence.

Proper control and regulation of the gas flows through the gas panel 130 is performed by mass flow controllers (not shown) and the microprocessor controller 54 (FIG. 1). The showerhead 120 allows process gases from the gas panel 130 to be uniformly introduced and distributed in the CVD process chamber 36.

The showerhead 120 and the wafer support pedestal 150 also form a pair of spaced apart electrodes. When an electric field is generated between these electrodes, the process gases introduced into CVD process chamber 36 are ignited into a plasma. Typically, the electric field is generated by connecting the wafer support pedestal to a source of radio frequency (RF) power (not shown) through a matching network (not shown). Alternatively, the RF power source and matching network may be coupled to the showerhead 120, or coupled to both the showerhead 120 and the wafer support pedestal 150.

Optionally, a remote plasma source 180 may be coupled to the CVD process chamber 36 to provide a remotely generated plasma to the process chamber 36. The remote plasma source 180 includes a gas supply 153, a gas flow controller 155, a plasma chamber 151, and a chamber inlet 157. The gas flow controller 155 controls the flow of process gas from the gas supply 153 to the plasma chamber 151.

A remote plasma may be generated by applying an electric field to the process gas in the plasma chamber 151, creating a plasma of reactive species. Typically, the electric field is generated in the plasma chamber 151 using an RF power source (not shown). The reactive species generated in the remote plasma source 180 are introduced into the process chamber 36 through inlet 157.

A remote plasma may be generated by applying an electric field to the process gas in the plasma chamber 151, creating a plasma of reactive species. Typically, the electric field is generated in the plasma chamber 151 using an RF power source (not shown). The reactive species generated in the remote plasma source 150 are introduced into the process chamber 36 through inlet 157.

Figure 3:
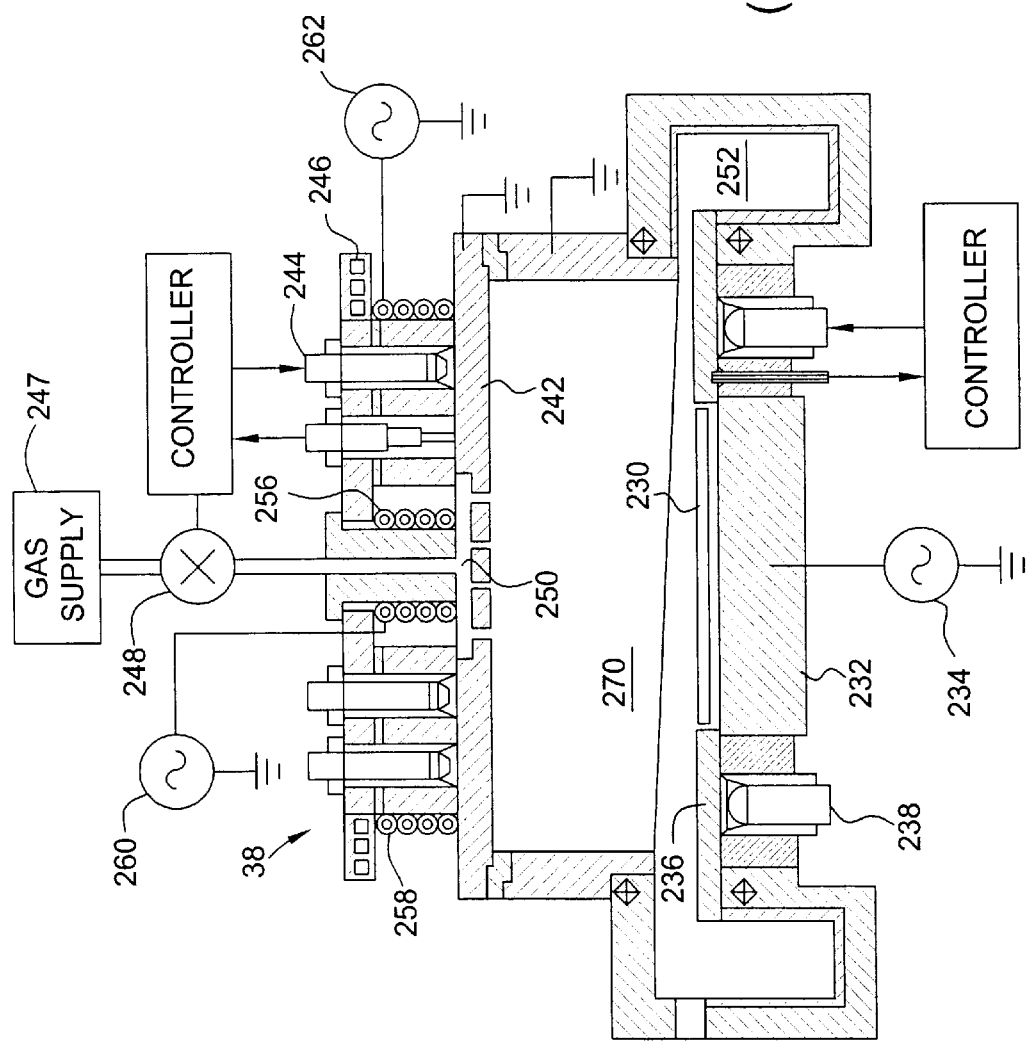
FIG. 3 depicts a cross-sectional view of a plasma etch chamber that can be used for the practice of embodiments described herein.

FIG. 3 depicts a schematic cross-sectional view of a plasma etch process chamber 38 of wafer processing system 35. Plasma etch process chamber 38 may be used to etch silicon carbide and/or organosilicate layers on semiconductor wafers. Examples of such a plasma etch process chamber 38 include SUPER-E™ chambers and E-MAX™ chambers, commercially available from Applied Materials, Inc., Santa Clara, Calif.

Details of the plasma etch process chamber 38 are described in commonly assigned U.S. Pat. No. 6,063,233, entitled "Thermal Control Apparatus for Inductively Coupled RF Plasma Reactor having an Overhead Solenoid Antenna", issued on May 16, 2000 and is herein incorporated by reference. The salient features of the plasma etch process chamber 38 are briefly described below.

The plasma etch process chamber 38 generally houses a cathode pedestal 232, which is used to support a substrate such as a semiconductor wafer 230. A bias power supplied from a bias power supply 234 to the cathode pedestal 232 capacitatively couples the semiconductor wafer 230 thereto. Application of the bias power to the cathode pedestal 232 also enhances the transport of plasma species (e. g., ions) created in the plasma etch process chamber 38 toward the surface of the semiconductor wafer 230.

Depending on the specific process, the semiconductor wafer 230 can be heated to some desired temperature prior to an etch process. For example, the cathode pedestal 232 may be heated by a silicon ring 236. The silicon ring 236 surrounds the cathode pedestal 232 and is controllably heated by an array of heater lamps 238. The semiconductor wafer 230 is, in turn, heated by the cathode pedestal 232.

A vacuum pump 252, is used to evacuate the plasma etch process chamber 38 and to maintain the proper gas flows and pressure inside the chamber 38. A showerhead 250, through which process gases are introduced into plasma etch process chamber 38, is located above cathode pedestal 232. The showerhead is coupled to a gas supply 247, which controls and supplies various gases used in different steps of the etch process sequence.

Proper control and regulation of the gas flows from the gas supply 247 is performed by mass flow controllers 248 and the microprocessor controller 54 (FIG. 1). The showerhead 250 allows process gases from the gas supply 247 to be uniformly introduced and distributed in the plasma etch process chamber 38.

A silicon roof 242 overlays a plasma processing region 270 of the plasma etch process chamber 38. Heating lamps 244 and water cooling channels 246 control the temperature of the silicon roof 242.

An inner inductive coil stack 256 and an outer inductive coil stack 258 are mounted above the silicon roof 242. The inner inductive coil stack 256 is coupled to RF power supply 260 and outer inductive coil stack 258 is coupled to RF power supply 262. The resistivity and thickness of the silicon roof 242 are chosen to permit axial RF magnetic fields produced by the inductive coil stacks 256, 258 to pass therethrough.

The inner inductive coil stack 256 and the outer inductive coil stack 258 inductively couple RF energy through the silicon roof 242 into a plasma process region 270 of the plasma etch process chamber 38, generating a plasma of reactive species therein. Alternatively, a single RF power supply (not shown) with an adjustable splitter (not shown) may be coupled to both the inner inductive coil stack 256 as well as the outer inductive coil stack 258.

Referring to FIG. 1, both the CVD process chamber 36 and the plasma etch process chamber 38 are controlled by a microprocessor controller 54. The microprocessor controller 54 may be one of any form of general purpose computer processor (CPU) that can be used in an industrial setting for controlling various chambers and sub-processors. The computer may use any suitable memory, such as random access memory, read only memory, floppy disk drive, hard disk, or any other form of digital storage, local or remote. Various support circuits may be coupled to the CPU for supporting the processor in a conventional manner. Software routines as required may be stored in the memory or executed by a second CPU that is remotely located.

The software routines are executed after the substrate is positioned on the pedestal. The software routines, when executed, transforms the general purpose computer into a specific process computer that controls the chamber operation so that a chamber process is performed. Alternatively, the process of the present invention may be performed in hardware, as an application specific integrated circuit or other type of hardware implementation, or a combination of software or hardware.

Plasma Chamber Cleaning Processes

Figure 4:
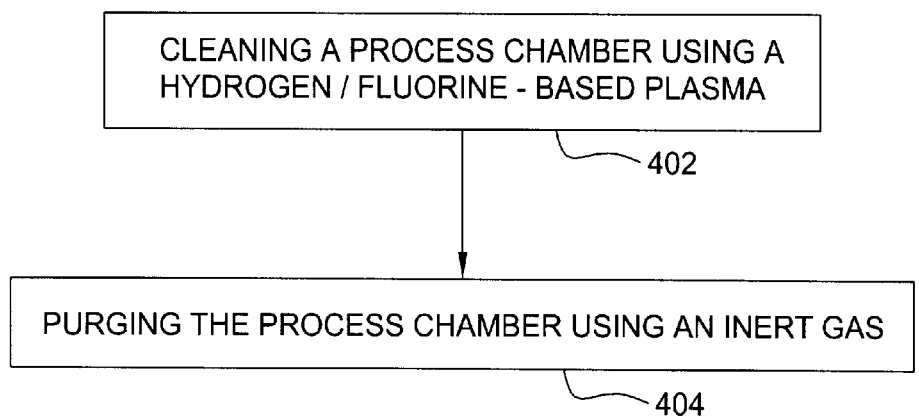
FIG. 4 depicts a process sequence that can be used for cleaning the process chambers described in either FIGS. 2 or 3.

FIG. 4 illustrates one embodiment for cleaning silicon carbide and/or organosilicate layers from interior surfaces of process chambers similar to those depicted in FIGS. 2–3. The silicon carbide and/or organosilicate layers are cleaned from interior surfaces of process chambers using a hydrogen/fluorine-based plasma (Step 402).

The hydrogen/fluoride-based plasma is generated by applying an electric field to a gas mixture comprising a hydrogen source and a fluorine source. The hydrogen source and the fluorine source may be one or more gases selected from the group consisting of hydrogen ($H_2$), methane ($CH_4$), trifluoromethane ($CHF_3$), fluoromethane ($CH_3F$), hydrogen fluoride (HF) carbon tetrafluoride ($CF_4$), nitrogen trifluoride ($NF_3$), ammonia ($NH_3$), sulfur hexafluoride ($SF_6$), and fluoroethane ($C_2F_6$).

The gas mixture may optionally include an oxygen source. Oxygen ($O_2$), ozone ($O_3$), nitrous oxide ($N_2O$), carbon monoxide (CO), carbon dioxide ($CO_2$), or combinations thereof, among others may be used as the oxygen source.

In general the following process parameters can be used to generate a hydrogen/fluorine-based plasma using a process chamber similar to that shown in FIGS. 2–3. The process parameters range from a chamber temperature of about 65° C. to about 300° C., a chamber pressure of about 1 torr to about 20 torr, a hydrogen source flow rate of about 5 sccm to about 500 sccm, a fluorine source flow rate of about 25 sccm to about 1000 sccm, an oxygen source flow rate of about 10 sccm to about 600 sccm, and a radio frequency (RF) power of about 1 Watt/cm$^2$ to about 20 Watts/cm$^2$. The above process parameters provide an etch rate for silicon carbide and/or organosilicate layers in a range of about 5000 Å/min to about 10000 Å/min when implemented on a process chamber configured to accommodate 200 mm (millimeter) substrates available from Applied Materials, Inc, Santa Clara, Calif.

Other process chambers are within the scope of the invention, and the parameters listed above may vary according to the particular process chamber used to either deposit or etch silicon carbide and/or organosilicate layers. For example, other process chambers may have a larger (e. g., configured to accommodate 300 mm substrates) or smaller volume, requiring gas flow rates that are larger or smaller than those recited for process chambers available from Applied Materials, Inc.

It is believed that the hydrogen/fluorine-based plasma aids in the cleaning of silicon carbide and/or organosilicate layers by breaking carbon-silicon bonds present in such compounds so as to form volatile hydrogen containing species such as silane ($SiH_4$) as well methane ($CH_4$), that are subsequently exhausted from the process chamber.

Prior to cleaning the process chamber using the hydrogen/fluorine-based plasma, the process chamber may optionally be treated with an oxygen ($O_2$) plasma. It is believed that the oxygen plasma treatment forms silicon oxides that can be etched using the fluorine-based gases in the hydrogen/fluorine-based plasma.

In general the following process parameters can be used to generate an oxygen plasma using a process chamber similar to that shown in FIGS. 2–3. The process parameters range from a chamber temperature of about 150° C. to about 300° C., a chamber pressure of about 1 torr to about 20 torr, an oxygen source flow rate of about 10 sccm to about 600 sccm, and a radio frequency (RF) power of about 1 Watt/cm$^2$ to about 20 Watts/cm$^2$.

After the silicon carbide and/or organosilicate layers are cleaned from interior surfaces of the process chamber, the chamber is purged using an inert gas (Step 404). Helium (He), argon (Ar), and nitrogen ($N_2$), among others may be used for the inert gas.

Figure 5:
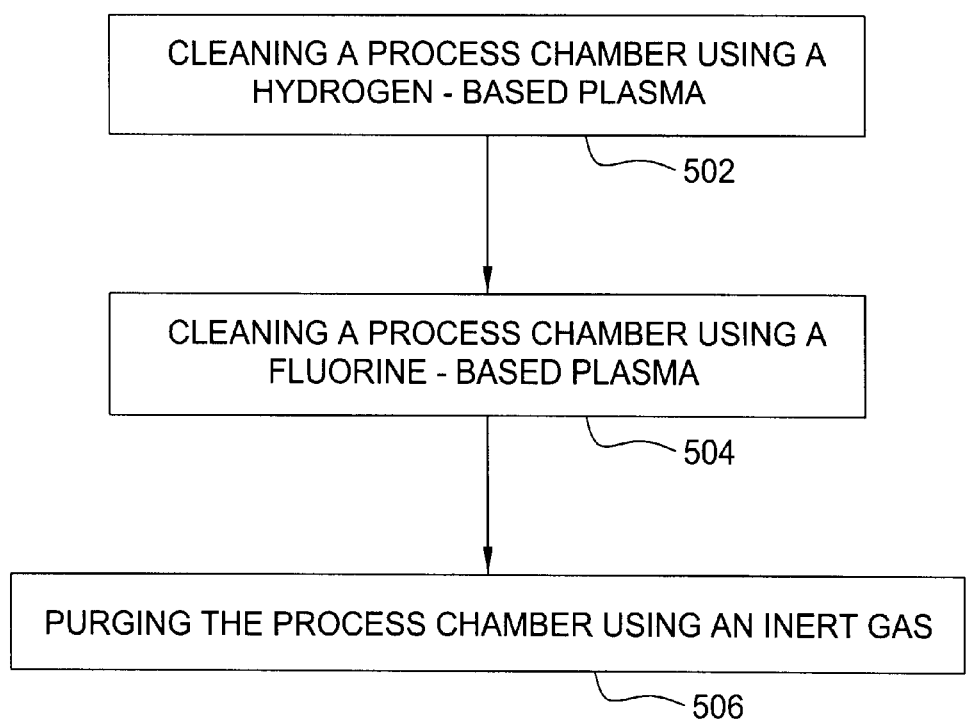
FIG. 5 depicts an alternate process sequence that can be used for cleaning the process chambers described in either FIGS. 2 or 3.

FIG. 5 illustrates an alternate embodiment for cleaning silicon carbide and/or organosilicate layers from interior surfaces of process chambers similar to those depicted in FIGS. 2–3. The silicon carbide and/or organosilicate layers are cleaned from interior surfaces of process chambers using a hydrogen-based plasma (Step 502) followed by a fluorine-based plasma (Step 504) and an inert gas purge (Step 506). Alternatively, the silicon carbide and/or organosilicate layers may be cleaned from interior surfaces of process chambers using a fluorine-based plasma followed by a hydrogen-based plasma.

The hydrogen-based plasma and the fluorine-based plasma may be generated according to the process parameters detailed above with reference to FIG. 4. Prior to cleaning the process chamber using the hydrogen-based plasma followed by the fluorine-based plasma, the process chamber may optionally be treated with an oxygen ($O_2$) plasma according to the process conditions discussed above.

Although several preferred embodiments which incorporate the teachings of the present invention have been shown and described in detail, those skilled in the art can readily

What is claimed is:

1. A method of cleaning a process chamber by removing silicon carbide and/or organosilicates layers formed on the interior surfaces of the process chamber, comprising:

treating interior surfaces of the process chamber with a hydrogen-based plasma generated by providing a first gas mixture, having a hydrogen source, to the process chamber and applying an electric field to the first gas mixture; and then treating interior surfaces of the process chamber with a fluorine-based plasma generated by providing a gas mixture, having a fluorine source, to the process chamber and applying an electric field to the gas mixture, wherein the hydrogen-based plasma and the fluorine-based plasma are each used to react with the silicon carbide and/or organosilicates layers formed on the interior surfaces of the process chamber and the hydrogen source and the fluorine source comprise one or more gases selected from the group consisting of hydrogen ($H_2$), carbon tetrafluoride ($CF_4$), nitrogen trifluoride ($NF_3$), ammonia ($NH_3$), methane ($CH_4$), sulfur hexafluoride ($SF_6$), and fluoroethane ($C_2F_6$).

2. The method of claim 1, wherein the gas mixture further comprises an oxygen source.

3. The method of claim 2 wherein the oxygen source comprises one or more gases selected from the group consisting of oxygen ($O_2$), nitrous oxide ($N_2O$), ozone ($O_3$), carbon monoxide (CO), and carbon dioxide ($CO_2$).

4. The method of claim 1, wherein the hydrogen source is provided to the process chamber at a flow rate in a range of about 5 sccm to about 500 sccm.

5. The method of claim 1, wherein the fluorine source is provided to the process chamber at a flow rate in a range of about 25 sccm to about 1000 sccm.

6. The method of claim 2 wherein the oxygen source is provided to-the process chamber at a flow rate in a range of about 10 sccm to about 600 sccm.

7. The method of claim 1, wherein the electric field applied to the gas mixture in the process chamber is a radio frequency (RF) power.

8. The method of claim 1, wherein the process chamber is maintained at a temperature between about 65° C. to about 300° C.

9. The method of claim 1, wherein the process chamber is maintained at a pressure less then about 200 torr.

10. The method of claim 1, further comprising treating interior surfaces of the process chamber with an oxygen plasma prior to cleaning the process chamber using the hydrogen/fluorine plasma.

11. The method of claim 1, further comprising:

purging the process chamber using an inert gas after interior surfaces of the process chamber have been plasma cleaned.

12. The method of claim 11 wherein the inert gas is selected from the group consisting of helium (He), argon (Ar), and nitrogen ($N_2$).

13. The method of claim 1 wherein the process chamber is a chemical vapor deposition (CVD) chamber.

14. The method of claim 1 wherein the process chamber is a plasma etch chamber.

15. The method of claim 1 wherein the hydrogen/fluorine-based plasma is provided to the process chamber from a remotely located plasma chamber.

16. A method of cleaning a process chamber, comprising:

treating interior surfaces of the process chamber with a hydrogen-based plasma generated by providing a gas mixture, having a hydrogen source, to the process chamber and applying an electric field to the gas mixture; and then treating interior surfaces of the process chamber with a fluorine-based plasma generated by providing a gas mixture, having a fluorine source, to the process chamber and applying an electric field to the gas mixture, wherein the hydrogen-based plasma and the fluorine-based plasma are each used to remove material layers formed on interior surfaces the process chamber and generated using gases selected from the group consisting of hydrogen ($H_2$), carbon tetrafluoride ($CF_4$), nitrogen trifluoride ($NF_3$), ammonia ($NH_3$), methane ($CH_4$), sulfur hexafluoride ($SF_5$), and fluoroethane ($C_2F_6$).

17. The method of claim 16, wherein the gas mixture having a hydrogen source further comprises an oxygen source.

18. The method of claim 17 wherein the oxygen source comprises one or more gases selected from the group consisting of oxygen ($O_2$), nitrous oxide ($N_2O$), ozone ($O_3$), carbon monoxide (CO), and carbon dioxide ($CO_2$).

19. The method of claim 16, wherein the hydrogen source is provided to the process chamber at a flow rate in a range of about 5 sccm to about 500 sccm.

20. The method of claim 16, wherein the fluorine source is provided to the process chamber at a flow rate in a range of about 25 sccm to about 600 sccm.

21. The method of claim 17 wherein the oxygen source is provided to the process chamber at a flow rate in a range of about 10 sccm to about 600 sccm.

22. The method of claim 16, wherein the electric field applied to the gas mixtures of steps (d) and (f) is a radio frequency (RF) power.

23. The method of claim 16, wherein the process chamber is maintained at a temperature between about 65° C. to about 300° C.

24. The method of claim 16, wherein the process chamber is maintained at a pressure less than about 20 torr.

25. The method of claim 16, further comprising treating interior surfaces of the process chamber with an oxygen-based plasma prior to cleaning the process chamber with the hydrogen-based plasma.

26. The method of claim 16, further comprising:

purging the process chamber using an inert gas after interior surfaces of the process chamber have been plasma cleaned.

27. The method of claim 26 wherein the inert gas is selected from the group consisting of helium (He), argon (Ar), and nitrogen ($N_2$).

28. The method of claim 16, wherein each plasma is provided to the process chamber from one or more remotely located plasma chambers.

29. A method of cleaning a process chamber, comprising:

treating interior surfaces of the process chamber with a fluorine-based plasma generated by providing a gas mixture, having a fluorine source, to the process chamber and applying an electric field to the gas mixture; and then treating interior surfaces of the process chamber with a hydrogen-based plasma generated by providing a gas mixture, having a hydrogen source, to the process chamber and applying an electric field to the gas mixture, wherein the fluorine-based plasma and the hydrogen-based plasma are used to remove material layers formed on interior surfaces of the process chamber and generated using gases selected from the group consisting of hydrogen ($H_2$), carbon tetrafluoride ($CF_4$), nitrogen trifluoride ($NF_3$), ammonia ($NH_3$), methane ($CH_4$), sulfur hexafluoride ($SF_6$), and fluoroethane ($C_2F_6$).

30. The method of claim 29, wherein the gas mixture having a fluorine source further comprises an oxygen source.

31. The method of claim 30 wherein the oxygen source comprises one or more gases selected from the group consisting of oxygen ($O_2$), nitrous oxide ($N_2O$), ozone ($O_3$), carbon monoxide (CO), and carbon dioxide ($CO_2$).

32. The method of claim 29, wherein the fluorine source is provided to the process chamber at a flow rate in a range of about 25 sccm to about 1000 sccm.

33. The method of claim 29, wherein the hydrogen source is provided to the process chamber at a flow rate in a range of about 5 sccm to about 500 sccm.

34. The method of claim 30 wherein the oxygen source is provided to the process chamber at a flow rate in a range of about 10 sccm to about 600 sccm.

35. The method of claim 29, wherein each electric field applied to the gas mixtures is a radio frequency (RF) power.

36. The method of claim 29, wherein the process chamber is maintained at a temperature between about 65° C. to about 300° C.

37. The method of claim 29, wherein the process chamber is maintained at a pressure less than about 20 torr.

38. The method of claim 29, further comprising treating interior surfaces of the process chamber with an oxygen-based plasma prior to cleaning the process chamber with the fluorine-based plasma.

39. The method of claim 29, further comprising:
purging the process chamber using an inert gas after interior surfaces of the process chamber have been plasma cleaned.

40. The method of claim 39 wherein the inert gas is selected from the group consisting of helium (He), argon (Ar), and nitrogen ($N_2$).

41. The method of claim 29, wherein each plasma is provided to the process chamber from one or more remotely located plasma chambers.

42. A computer storage medium containing a software routine that, when executed, causes a general purpose computer to control a process chamber using a cleaning method to remove silicon carbide and/or organosilicates layers formed on the interior surfaces of the process chamber, comprising:
treating interior surfaces of the process chamber with a fluorine-based plasma generated by providing a gas mixture, having a fluorine source, to the process chamber and applying an electric field to the gas mixture; and then
treating interior surfaces of the process chamber with a hydrogen-based plasma generated by providing a gas mixture, having a hydrogen source, to the process chamber and applying an electric field to the gas mixture, wherein the hydrogen-based plasma and the fluorine-based plasma are each used to react with the silicon carbide and/or organosilicates layers formed on the interior surfaces of the process chamber and the hydrogen source and the fluorine source comprise one or more gases selected from the group consisting of hydrogen ($H_2$), carbon tetrafluoride ($CF_4$), nitrogen trifluoride ($NF_3$), ammonia ($NH_3$), methane ($CH_4$), sulfur hexafluoride ($SF_6$), and fluoroethane ($C_2F_6$).

43. The computer storage medium of claim 42, wherein the gas mixture further comprises an oxygen storage.

44. The computer storage medium of claim 43 wherein the oxygen source comprises one or more gases selected from the group consisting of oxygen ($O_2$), nitrous oxide ($N_2O$), ozone ($O_3$), carbon monoxide (CO), and carbon dioxide ($CO_2$).

45. The computer storage medium of claim 42, wherein the hydrogen source is provided to the process chamber at a flow rate in a range of about 5 sccm to a about 500 sccm.

46. The computer storage medium of claim 42, wherein the fluorine source is provided to the process chamber at a flow rate in a range of about 25 sccm to about 1000 sccm.

47. The computer storage medium of claim 43 wherein the oxygen source is provided to the process chamber at a flow rate in a range of about 10 sccm to about 600 sccm.

48. The computer storage medium of claim 42, wherein the electric field applied to the gas mixture in the process chamber is a radio frequency (RF) power.

49. The computer storage medium of claim 48 wherein the RF power is within a range of about 1 Watts/cm$^2$ to about 20 Watts/cm$^2$.

50. The computer storage medium of claim 42, wherein the process chamber is maintained at a temperature between about 65° C. to about 300° C.

51. The computer storage medium of claim 42, wherein the process chamber is maintained at a pressure less than about 20 torr.

52. The computer storage medium of claim 42, further comprising treating interior surfaces of the process chamber with an oxygen plasma prior to plasma cleaning the process chamber using the hydrogen source and the fluorine source.

53. The computer storage medium of claim 42, further comprising:
purging the process chamber using an inert gas after interior surfaces of the process chamber have been plasma cleaned.

54. The computer storage medium of claim 53 wherein the inert gas is selected from the group consisting of helium (He), argon (Ar), and nitrogen ($N_2$).

55. The computer storage medium of claim 42 wherein the hydrogen/fluorine-based plasma is provided to the process chamber from a remotely located plasma chamber.

56. A method of cleaning a process chamber, comprising:
treating interior surfaces of the process chamber with an oxygen-based plasma generated by providing a gas mixture, having an oxygen source, to the process chamber, and applying an electric field to the gas mixture; and then
treating interior surfaces of the process chamber with a plasma comprising hydrogen and fluorine generated by providing a gas mixture using gases selected from the group consisting of hydrogen ($H_2$), fluoromethane ($CH_3F$), carbon tetrafluoride ($CF_4$), ammonia ($NH_3$), methane ($CH_4$), sulfur hexafluoride ($SF_6$), and fluoroethane ($C_2F_6$) to the process chamber, and applying an electric field to the gas mixture, wherein the oxygen-based plasma and the plasma comprising hydrogen and fluorine are used to remove material layers formed on interior surfaces of the process chamber.

57. The method of claim 56, wherein the oxygen source comprises one or more gases selected from the group consisting of oxygen ($O_2$), nitrous oxide ($N_2O$), ozone ($O_3$), carbon monoxide (CO), and carbon dioxide ($CO_2$).

58. The method of claim 56, further comprising treating interior surfaces of the process chamber with a fluorine-based plasma generated by providing a nitrogen trifluoride ($NF_3$) gas to the process chamber and applying an electric field to the nitrogen trifluoride to increase the removal of other material layers formed on interior surfaces of the process chamber.

59. A method of cleaning a process chamber, comprising:
treating interior surfaces of the process chamber with an oxygen-based plasma generated by providing a gas mixture, having an oxygen source, to the process chamber, and applying an electric field to the gas mixture; and then
treating interior surfaces of the process chamber with a hydrogen/fluorine-based plasma generated by providing a gas mixture, having a hydrogen source and fluorine source, to the process chamber, and applying an electric field to the gas mixture, wherein the oxygen-based plasma and the hydrogen/fluorine-based plasma are used to remove material layers formed on interior surfaces of the process chamber; and then
treating interior surfaces of the process chamber with a fluorine-based plasma generated by providing a nitrogen trifluoride ($NF_3$) gas to the process chamber and applying an electric field to the nitrogen trifluoride to increase the removal of the material layers formed on interior surfaces of the process chamber.

60. The method of claim 59, wherein the oxygen source comprises one or more gases selected from the group consisting of oxygen ($O_2$), nitrous oxide ($N_2O$), ozone ($O_3$), carbon monoxide (CO), and carbon dioxide ($CO_2$).

61. The method of claim 59, wherein the hydrogen source and the fluorine source comprise one or more gases selected from the group consisting of hydrogen ($H_2$), fluoromethane ($CH_3F$), carbon tetrafluoride ($CF_4$), ammonia ($NH_3$), methane ($CH_4$), sulfur hexafluoride ($SF_6$), and fluoroethane ($C_2F_6$).

62. A method of cleaning a process chamber to remove silicon carbide and/or organosilicates layers formed on interior surfaces of the process chamber, comprising:
treating interior surfaces of the process chamber with an oxygen-based plasma generated by providing a gas mixture, having an oxygen source, to the process chamber, and applying an electric field to the gas mixture; and then
treating interior surfaces of the process chamber with a hydrogen/fluorine-based plasma generated by providing a gas mixture using gases selected from the group consisting of hydrogen ($H_2$), fluoromethane ($CH_3F$), carbon tetrafluoride ($CF_4$), ammonia ($NH_3$), methane ($CH_4$), sulfur hexafluoride ($SF_6$), and fluoroethane ($C_2F_6$) to the process chamber, and applying an electric field to the gas mixture, wherein the oxygen-based plasma and the hydrogen/fluorine-based plasma are used to react with the silicon carbide and/or organosilicates layers formed on interior surfaces of the process chamber so as to remove such layers therefrom.

63. The method of claim 62, wherein the oxygen source comprises one or more gases selected from the group consisting of oxygen ($O_2$), nitrous oxide ($N_2O$), ozone ($O_3$), carbon monoxide (CO), and carbon dioxide ($CO_2$).

64. The method of claim 62, further comprising treating interior surfaces of the process chamber with a fluorine-based plasma generated by providing a nitrogen trifluoride ($NF_3$) gas to the process chamber and applying an electric field to the nitrogen trifluoride to increase the removal of the silicon carbide and/or organosilicates layers formed on interior surfaces of the process chamber.

65. A method of cleaning a process chamber to remove silicon carbide and/or organosilicates layers formed on interior surfaces of the process chamber, comprising:
treating interior surfaces of the process chamber with an oxygen-based plasma generated by providing a gas mixture, having an oxygen source, to the process chamber, and applying an electric field to the gas mixture; and then
treating interior surfaces of the process chamber with a hydrogen/fluorine-based plasma generated by providing a gas mixture, having a hydrogen source and a fluorine source, to the process chamber, and applying an electric field to the gas mixture, wherein the oxygen-based plasma and the hydrogen/fluorine-based plasma are used to react with the silicon carbide and/or organosilicates layers formed on interior surfaces of the process chamber so as to remove such layers therefrom; and then
treating interior surfaces of the process chamber with a fluorine-based plasma generated by providing a nitrogen trifluoride ($NF_3$) gas to the process chamber and applying an electric field to the nitrogen trifluoride to increase the removal of the silicon carbide and/or organosilicates layers formed on interior surfaces of the process chamber.

66. The method of claim 65, wherein the oxygen source comprises one or more gases selected from the group consisting of oxygen ($O_2$), nitrous oxide ($N_2O$), ozone ($O_3$), carbon monoxide (CO), and carbon dioxide ($CO_2$).

67. The method of claim 65, wherein the hydrogen source and the fluorine source comprise one or more gases selected from the group consisting of hydrogen ($H_2$), fluoromethane ($CH_3F$), carbon tetrafluoride ($CF_4$), ammonia ($NH_3$), methane ($CH_4$), sulfur hexafluoride ($SF_6$), and fluoroethane ($C_2F_6$).

* * * * *